(12) United States Patent
Guo et al.

(10) Patent No.: US 11,158,692 B1
(45) Date of Patent: Oct. 26, 2021

(54) DISPLAY PANEL, DISPLAY DEVICE, AND METHOD FOR MANUFACTURING A DISPLAY PANEL

(71) Applicant: Wuhan China Star Optoelectronics Semiconductor Display Technology Co., Ltd., Hubei (CN)

(72) Inventors: Qingxun Guo, Hubei (CN); Xiaoguang Zhu, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 193 days.

(21) Appl. No.: 16/624,801

(22) PCT Filed: Nov. 6, 2019

(86) PCT No.: PCT/CN2019/115901
§ 371 (c)(1),
(2) Date: Dec. 19, 2019

(87) PCT Pub. No.: WO2021/031370
PCT Pub. Date: Feb. 25, 2021

(30) Foreign Application Priority Data

Aug. 19, 2019 (CN) .......................... 201910762400.9

(51) Int. Cl.
*H01L 27/32* (2006.01)
*H01L 51/56* (2006.01)
*H01L 51/52* (2006.01)

(52) U.S. Cl.
CPC ...... *H01L 27/3246* (2013.01); *H01L 27/3276* (2013.01); *H01L 51/5253* (2013.01); *H01L 51/56* (2013.01); *H01L 2227/323* (2013.01)

(58) Field of Classification Search
CPC .......... H01L 27/32; H01L 51/56; H01L 51/52
See application file for complete search history.

(56) References Cited

U.S. PATENT DOCUMENTS

| | | | |
|---|---|---|---|
| 2014/0361260 A1* | 12/2014 | Kim ..................... | H01L 27/3246 257/40 |
| 2019/0006445 A1* | 1/2019 | Seok .................... | H01L 27/3211 |
| 2021/0057672 A1* | 2/2021 | Wu ....................... | H01L 51/5253 |

* cited by examiner

*Primary Examiner* — Dung A. Le
(74) *Attorney, Agent, or Firm* — Geoffrey Lottenberg Berger Singerman LLP

(57) ABSTRACT

A display panel, a display device, and a method for manufacturing a display panel are provided. The display panel includes a substrate and a display device layer. The substrate includes a display area and a non-display area positioned at a periphery of the display area. The display device layer is disposed on the substrate and includes an anode, a pixel defining layer, a common layer, and a cathode which are sequentially stacked. The anode covers the display area and extends to the non-display area, the pixel defining layer and the common layer are both disposed on the display area and neither extend to the non-display area on at least one side of the display area, and the cathode covers the common layer and extends to the non-display area to be in contact with the anode.

15 Claims, 3 Drawing Sheets

DISPLAY PANEL, DISPLAY DEVICE, AND METHOD FOR MANUFACTURING A DISPLAY PANEL

CROSS-REFERENCE TO RELATED APPLICATIONS

This application is the National phase under 35 U.S.C. § 371 of International Application No. PCT/CN2019/115901, filed Nov. 6, 2019, which claims the benefit of and priority to Chinese Patent Application No. 201910762400.9, filed Aug. 19, 2019. The entire contents of these patent applications are hereby incorporated by reference herein.

FIELD OF INVENTION

The present disclosure relates to the field of display technologies, and more particularly to a display panel, a display device, and a method for manufacturing a display panel.

BACKGROUND OF INVENTION

Active-matrix organic light emitting diode (AMOLED) display devices have self-luminous characteristics, flexible substrates, flexible low temperature poly-silicon (LTPS) processes, and high efficiency organic light emitting diode (OLED) display technologies. Compared with liquid crystal display (LCD) display devices, AMOLED display devices are self-illuminating, do not require backlights, and have the advantages of fast responses, high color gamut, high contrast, and low cost, etc. AMOLED display devices are considered one of the most promising products.

At present, narrow frames and high screen ratio are main development trends of AMOLED display devices, and corresponding products have obvious advantages in market competition. Therefore, how to further reduce a screen border and thus increase a screen ratio has become urgent issues for the panel industry.

In summary, current AMOLED display devices have issues that frames are wide, and the screen ratio is not high. Therefore, it is necessary to provide a display panel, a display device, and a method for manufacturing a display panel to improve the defect.

SUMMARY OF INVENTION

Embodiments of the present disclosure provide a display panel, a display device, and a method for manufacturing a display panel, which are used to solve issues that current active-matrix organic light emitting diode (AMOLED) display devices each have a wide frame and a low screen ratio.

An embodiment of the present disclosure provides a display panel. The display panel includes a substrate and a display device layer. The substrate includes a display area and a non-display area positioned at a periphery of the display area. The display device layer is disposed on the substrate and includes an anode, a pixel defining layer, a common layer, and a cathode which are sequentially stacked. The anode covers the display area and extends to the non-display area, the pixel defining layer and the common layer are both disposed on the display area and neither extend to the non-display area on at least one side of the display area, and the cathode covers the common layer and extends to the non-display area to be in contact with the anode.

In an embodiment of the present disclosure, the display panel further includes a driving signal line disposed on the non-display area on at least one side of the display area of the substrate, and the pixel defining layer and the common layer are not extended to the non-display area in which the driving signal line is disposed.

In an embodiment of the present disclosure, materials of the pixel defining layer and the common layer are both organic materials, and the pixel defining layer and the common layer extend to a portion of the non-display area where the driving signal line is disposed and are etched by a corresponding organic solvent.

In an embodiment of the present disclosure, the display panel further includes a voltage signal line disposed on the non-display area on at least one side of the display area of the substrate, the voltage signal line is connected to the anode, and the driving signal line is disposed between the display area and the voltage signal line.

In an embodiment of the present disclosure, the display panel further includes at least one first retaining wall and at least one second retaining wall, the at least one first retaining wall is formed on a side of the anode away from the substrate, the at least one first retaining wall is positioned on the non-display area, and the at least one second retaining wall is disposed at the non-display area not covered by the anode.

In an embodiment of the present disclosure, the display panel further includes an encapsulation layer including a first inorganic layer, a second inorganic layer, and an organic layer disposed between the first inorganic layer and the second inorganic layer, the first inorganic layer covers the display area and the non-display area, the organic layer covers the display area and extends to a side of the at least one first retaining wall away from the at least one second retaining wall, and the second inorganic layer covers the display area and the non-display area.

An embodiment of the present disclosure further provides a display device includes a display panel. The display panel includes a substrate and a display device layer. The substrate includes a display area and a non-display area positioned at a periphery of the display area. The display device layer is disposed on the substrate and includes an anode, a pixel defining layer, a common layer, and a cathode which are sequentially stacked. The anode covers the display area and extends to the non-display area, the pixel defining layer and the common layer are both disposed on the display area and neither extend to the non-display area on at least one side of the display area, and the cathode covers the common layer and extends to the non-display area to be in contact with the anode.

In an embodiment of the present disclosure, the display panel further includes a driving signal line disposed on the non-display area on at least one side of the display area of the substrate, and the pixel defining layer and the common layer are not extended to the non-display area in which the driving signal line is disposed.

In an embodiment of the present disclosure, materials of the pixel defining layer and the common layer are both organic materials, and the pixel defining layer and the common layer extend to a portion of the non-display area where the driving signal line is disposed and are etched by a corresponding organic solvent.

In an embodiment of the present disclosure, the display panel further includes a voltage signal line disposed on the non-display area on at least one side of the display area of the substrate, the voltage signal line is connected to the anode, and the driving signal line is disposed between the display area and the voltage signal line.

In an embodiment of the present disclosure, the display panel further includes at least one first retaining wall and at least one second retaining wall, the at least one first retaining wall is formed on a side of the anode away from the substrate, the at least one first retaining wall is positioned on the non-display area, and the at least one second retaining wall is disposed at the non-display area not covered by the anode.

In an embodiment of the present disclosure, the display panel further includes an encapsulation layer including a first inorganic layer, a second inorganic layer, and an organic layer disposed between the first inorganic layer and the second inorganic layer, the first inorganic layer covers the display area and the non-display area, the organic layer covers the display area and extends to a side of the at least one first retaining wall away from the at least one second retaining wall, and the second inorganic layer covers the display area and the non-display area.

An embodiment of the present disclosure further provides a method for manufacturing a display panel including: Step S10: providing a substrate, the substrate comprising a display area and a non-display area positioned at a periphery of the display area, Step S20: sequentially forming a pixel defining layer and a common layer on the substrate, the pixel defining layer and the common layer both covering the display area, and extending to the non-display area, and Step S30: occluding the display area, and removing the pixel defining layer and the common layer on the non-display area extending to at least one side of the display area.

In an embodiment of the present disclosure, a driving signal line is further formed on the substrate, the driving signal line is disposed on the non-display area on at least one side of the display area of the substrate, and the pixel defining layer and the common layer both extend to the non-display area in which the driving signal line is disposed in the step S20.

In an embodiment of the present disclosure, materials of the pixel defining layer and the common layer are both organic materials, and the pixel defining layer and the common layer extend to a portion of the non-display area where the driving signal line is disposed and are etched by a corresponding organic solvent.

Beneficial effects of an embodiment of the present disclosure are that, the embodiment removes the pixel defining layer and the common layer positioned on the non-display area of the substrate such that the pixel defining layer and the common layer exist only in the display area, thereby effectively reducing a width of the non-display area of the display panel and increasing a screen ratio of the display panel and a screen ratio of the display device.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
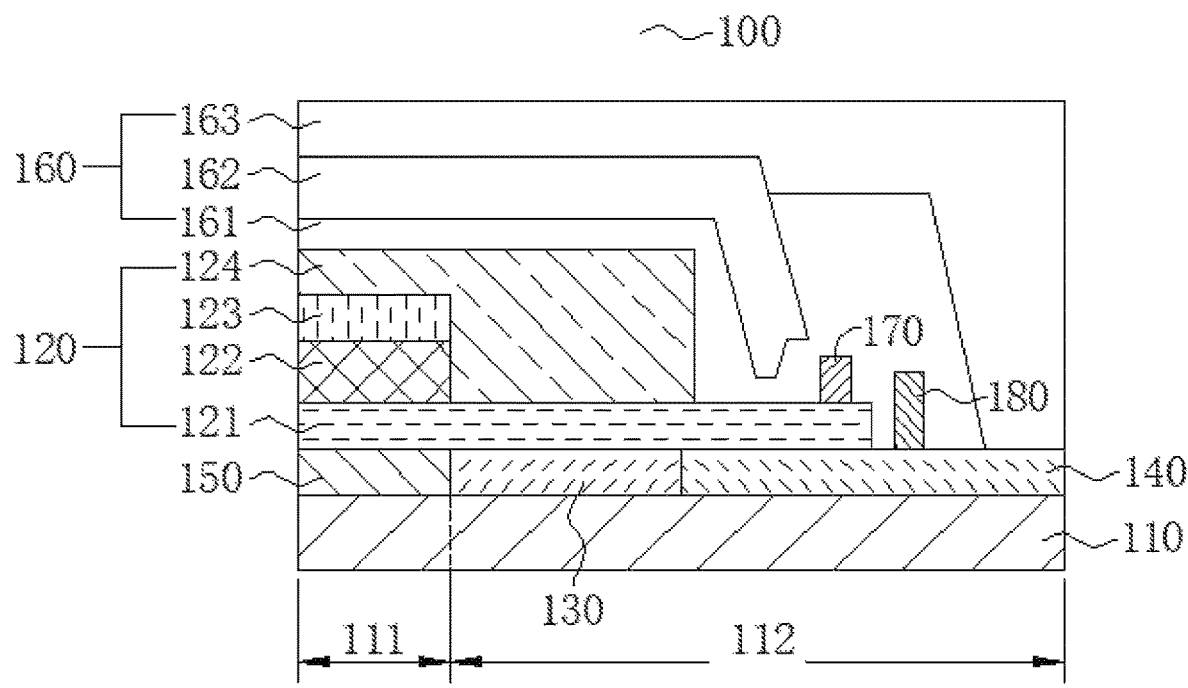
FIG. 1 is a schematic cross-sectional view of a display panel according to an embodiment 1 of the present disclosure.

The following description of the various embodiments is provided to illustrate the specific embodiments. Directional terms described by the present disclosure, such as top, bottom, front, back, left, right, inner, outer, side, etc., are only directions by referring to the accompanying drawings. The names of the elements mentioned in the present disclosure, such as first, second, etc., are only distinguishing between different components and can be better expressed. In the drawings, structurally similar elements are denoted by the same reference numerals.

The disclosure will be further described below in conjunction with the accompanying drawings and specific embodiments.

Embodiment 1

The embodiment of the present disclosure provides a display panel, which will be described in detail below with reference to FIG. 1 and FIG. 2.

As shown in FIG. 1, FIG. 1 is a schematic cross-sectional view of a display panel 100 according to an embodiment of the present disclosure. The display panel 100 includes a substrate 110, a display device layer 120, a driving signal line 130, and a voltage signal line 140.

Specifically, the substrate 110 includes a display area 111 and a non-display area 112 positioned at a periphery of the display area 111. The display device layer 120 is disposed on the substrate 110, and the display device layer 120 includes an anode 121, a pixel defining layer 122, a common layer 123, and a cathode 124 which are sequentially stacked.

In this embodiment, the anode 121 covers the display area 111 and extends to the non-display area 112. The pixel defining layer 122 and the common layer 123 are both disposed on the display area 111, and both extend to the non-display area 112 on at least one side of the display area 111. The cathode 124 is disposed on a side of the common layer 123 away from the substrate 110, covers the common layer 123, and extends to the non-display area 112 to be in contact with the anode 121. The common layer 123 includes a hole injection layer, a hole transport layer, a light emitting layer, an electron transport layer, and an electron injection layer (not shown).

Figure 2:
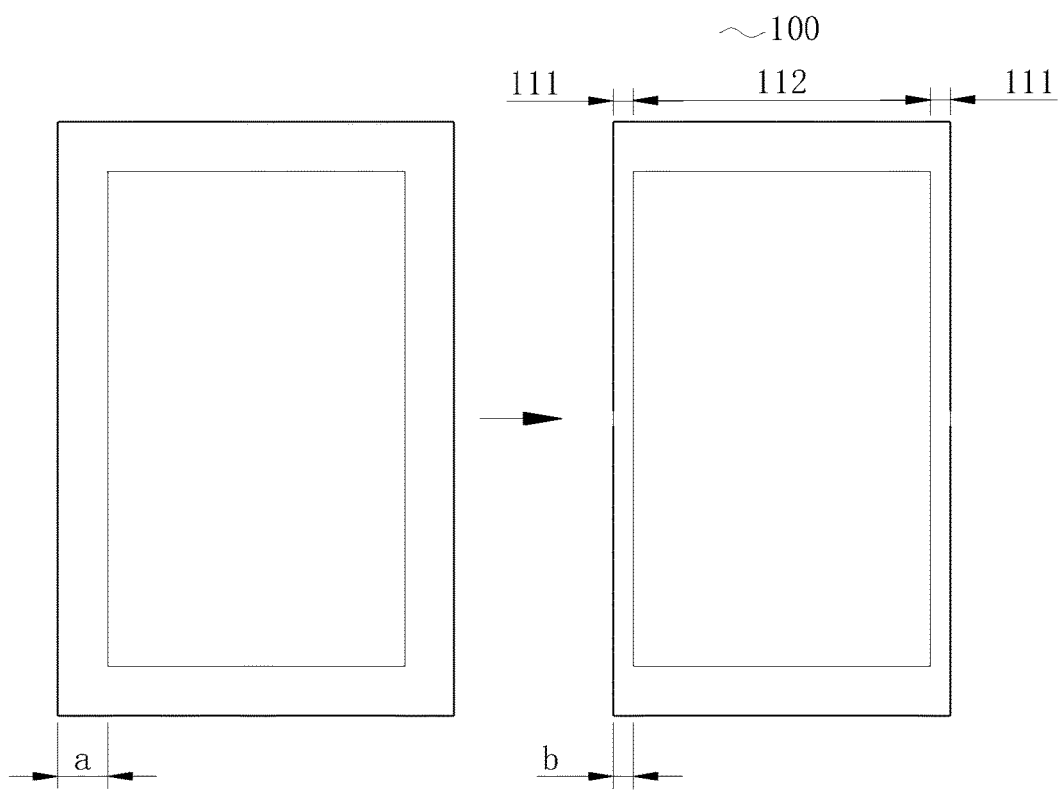
FIG. 2 is a schematic plan view showing the display panel according to the embodiment 1 of the present disclosure.

As shown in FIG. 2, FIG. 2 is a schematic plan view showing the display panel 100 according to an embodiment of the present disclosure. The left side is a prior art display panel, and the right side is the display panel 100 provided by the embodiment. Widths of non-display areas of left and right sides of the display panel of the prior art are a, and widths of non-display areas 112 of left and right sides of the display panel 100 of the embodiment is b, an edge of the pixel defining layer 122 and an edge of the common layer 123 are flush with an edge of the display area 111, such that b<a, thereby effectively reducing the widths of the non-display area 112 on the left and right sides of the display panel 100, and increasing a screen ratio of the display panel 100.

In some embodiments, the above structure can be used not only for the non-display areas 112 of the left and right sides of the display panel 100, but also for the non-display areas of the upper and lower sides of the display panel 100, and the same technical effects can be achieved.

In the embodiment, the driving signal line 130 is disposed on the non-display area 112 on at least one side of the display area 111 of the substrate 110. The pixel defining layer 122 and the common layer 123 both extend to the non-display area 112 in which the driving signal line 130 is disposed.

In this embodiment, materials of the pixel defining layer 122 and the common layer 123 are both organic materials, and the anode 121 is a metal material, so that when the pixel defining layer 122 and the common layer 123 are formed, the display region 111 may be shielded by a photoresist or a mask, and a portion of the pixel defining layer 122 and a portion of the common layer 123 extending to the non-display region 112 where the driving signal line 130 is disposed is removed by etching treatment through a corresponding organic solvent, thereby achieving the technical effect of reducing the width of the non-display area 112.

In this embodiment, as shown in FIG. 1, the voltage signal line 140 is disposed on the non-display area 112 on at least one side of the display area 111 of the substrate 110 and is connected to the anode 121. The driving signal line 130 is disposed between the display area 111 and the voltage signal line 140.

As shown in FIG. 1, the display panel 100 further includes a thin film transistor layer 150 disposed on the display region 111 and located between the anode 121 and the substrate 110. A gate of the transistor 150 is connected to the driving signal line 130.

As shown in FIG. 1, at least one first retaining wall 170 is formed on a side of the anode 121 away from the substrate 110, and the first retaining wall 170 is located on the non-display area 112. At least one second retaining wall 180 is further disposed at the non-display area 112 where the anode 121 is covered.

In this embodiment, the display panel 100 further includes an encapsulation layer 160 including a first inorganic layer 161, a second inorganic layer 163, and an organic layer 162 disposed between the first inorganic layer 161 and the second inorganic layer. The first inorganic layer 161 covers the display area 111 and the non-display area 112. The organic layer 162 covers the display area 111 and extends to a side of the first retaining wall 170 away from the second retaining wall 180. The second inorganic layer 163 covers the display area 111 and the non-display area 112. The first retaining wall 170 and the second retaining wall 180 serve to prevent the organic solution in the organic layer 162 from overflowing, thereby avoiding related issues caused by overflow of the organic solution.

The embodiment of the present disclosure provides a display panel 100 that reduces the width of the non-display portion 111 around the display panel 100 by confining the common layer 123 and the pixel defining layer 122 in the display device layer 120 to the display area 111 of the substrate 110. The screen ratio of the display panel 100 is increased.

The embodiment of the present disclosure further provides a display device, which includes the display panel 100 as described in the above embodiments and can achieve the same technical effects as the display panel 100 provided in the above embodiments, and details are not described herein again.

Embodiment 2

A method for manufacturing a display panel will be described in detail below with reference to FIGS. 3 to 4C.

Figure 3:
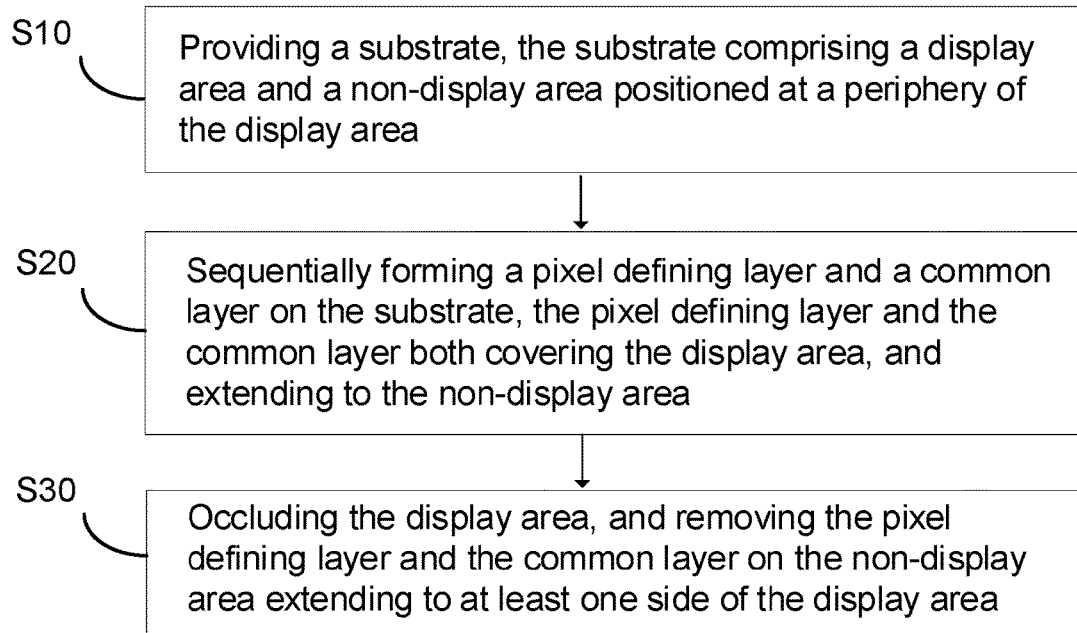
FIG. 3 is a schematic flowchart of a method for manufacturing a display panel according to an embodiment 2 of the present disclosure.
Figure 4A:
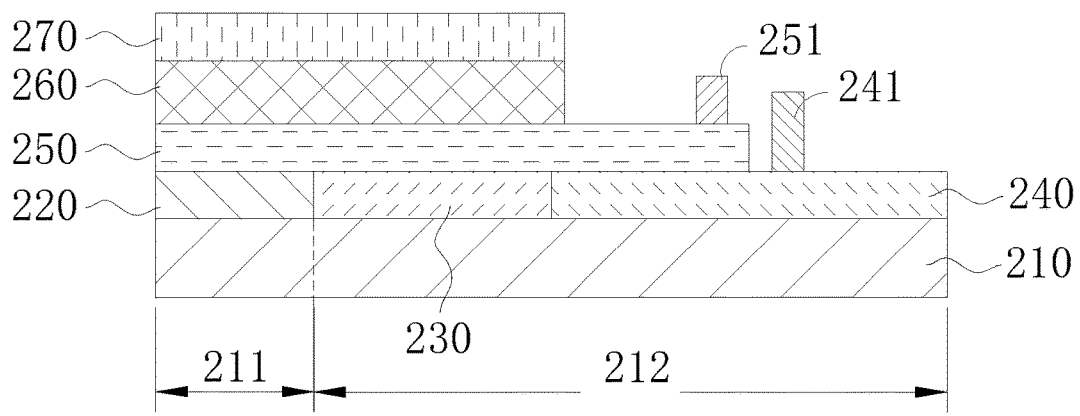
FIG. 4A is a schematic cross-sectional view of the display panel according to the embodiment 2 of the present disclosure.
Figure 4B:
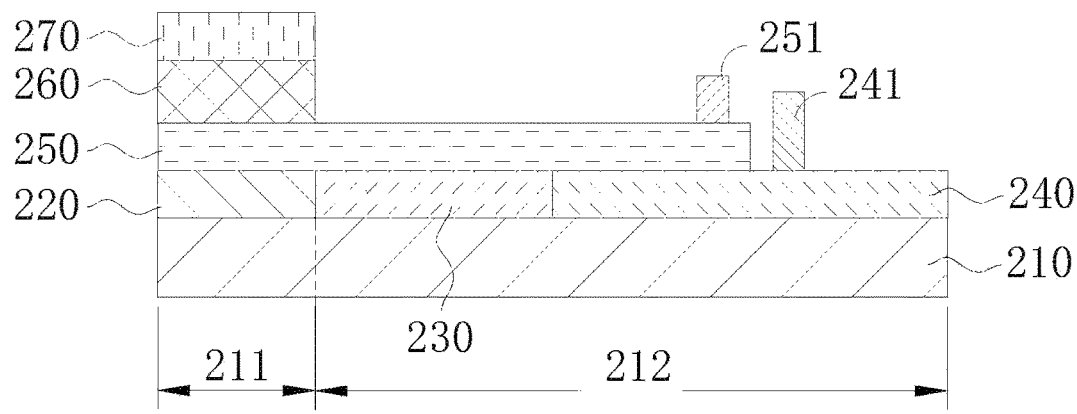
FIG. 4B is a schematic cross-sectional view of the display panel according to the embodiment 2 of the present disclosure.
Figure 4C:
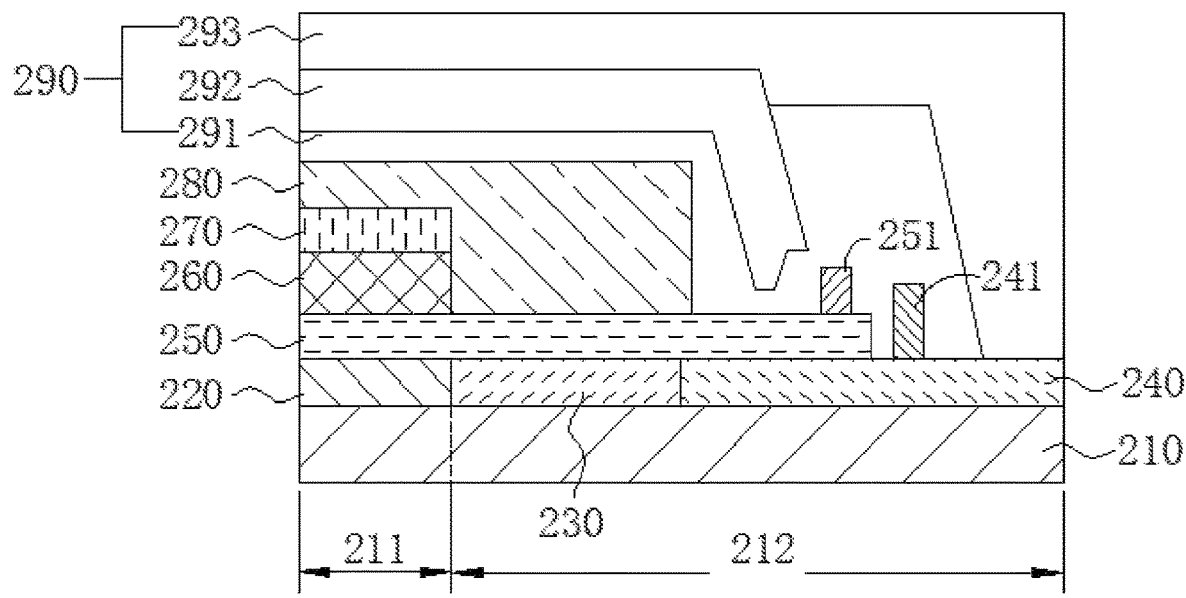
FIG. 4C is a schematic cross-sectional view of the display panel according to the embodiment 2 of the disclosure.

As shown in FIG. 3, FIG. 3 is a schematic flowchart of a method for manufacturing a display panel according to an embodiment of the present disclosure, and FIG. 4A to FIG. 4C are schematic cross-sectional views of a display panel 200 according to an embodiment of the present disclosure. The method includes:

Step S10: providing a substrate 210, the substrate 210 including a display area 211 and a non-display area 212 positioned at a periphery of the display area 211 is provided.

As shown in FIG. 4A, a thin film transistor layer 220, a driving signal line 230, a voltage signal line 240, and an anode 250 are further formed on the substrate 210. The driving signal line 230 is disposed on the display area 211 of the substrate 210. On the non-display area 212 of at least one side, a gate of the thin film transistor layer 220 is connected to the driving signal line 230, and the voltage signal line 240 is disposed on the display area 211 of the substrate 210. The non-display area 212 on one side is connected to the anode 221, and the driving signal line 230 is disposed between the display area 211 and the voltage signal line 240.

Step S20: sequentially forming a pixel defining layer 260 and a common layer 270 on the substrate 210, the pixel defining layer 260 and the common layer 270 both covering the display area 211 and extending to the non-display area 212 are provided.

Specifically, the pixel defining layer 260 is disposed on a side of the anode 250 away from the substrate 210, and the common layer 270 is disposed on a side of the pixel defining layer 260 away from the anode 250. The pixel defining layer 260 and the common layer 270 each extend to the non-display area 212 where the driving signal line 240 is disposed. The common layer 270 further includes a hole injection layer, a hole transport layer, a light emitting layer, an electron transport layer, and an electron injection layer (not shown).

Step S30: occluding the display area 211 and removing the pixel definition layer 260 and the common layer 270 on the non-display area 212 extending to at least one side of the display area 211 is provided.

Specifically, the display area 211 and the pixel defining layer 260 and the common layer 270 located on the display area 211 may be shielded by using a mask. In some embodiments, the display area 211 and the pixel defining layer 260 and the common layer 270 located on the display area 211 may also be blocked by applying a photoresist. Therefore, when the pixel defining layer 260 and the common layer 270 of other portions are removed, the display region 211 and the film layer above are prevented from being damaged.

In this embodiment, the anode, the driving signal line and the voltage signal line are all metal materials, and the materials of the pixel defining layer 260 and the common layer 270 are both organic materials. In the step S30, the portion of the pixel defining layer 222 and the portion of the common layer 223 extending to the non-display area 212 where the driving signal line 230 is disposed is removed by etching with a corresponding organic solvent, thereby the technical effect of reducing the width of the non-display area 212 is achieved.

In this embodiment, the manufacturing method further includes:

Step S40: forming a cathode 280 on a side of the common layer 270 away from the substrate 210, the cathode 280 covering the common layer 270 and extending to the non-display area to be in contact with the anode 250 is provided.

Step S50: forming an encapsulation layer 290 on a side of the cathode 280 away from the substrate 210 is provided.

In this embodiment, as shown in FIG. 4B, at least one first retaining wall 251 is formed on a side of the anode 220 away from the substrate 210, and the first retaining wall 251 is located in the non-display area 212. At least one second retaining wall 241 is further disposed at the non-display area 212 not covered by the cathode 121.

Specifically, as shown in FIG. 4C, the encapsulation layer 290 includes a first inorganic layer 291, a second inorganic layer 293, and an organic layer 292 disposed between the first inorganic layer 291 and the second inorganic layer 293. The first inorganic layer 291 covers the display area 211 and the non-display area 212. The organic layer 292 covers the display area 211 and extends to a side of the first retaining wall 251 away from the second retaining wall 241. The second inorganic layer 293 covers the display area 211 and the non-display area 212. The first retaining wall 251 and the second retaining wall 241 serve to prevent the organic solution in the organic layer 292 from overflowing, thereby avoiding related issues caused by overflow of the organic solution.

The embodiment of the present disclosure provides a method for manufacturing a display panel, wherein a portion of the pixel defining layer 222 and a portion of the common layer 223 extend to the non-display region 212 where the driving signal line 230 is disposed to be etched by a corresponding organic solvent, so as to reduce the width of the non-display area 212 of the display panel 200, thereby increasing the screen ratio of the display panel 200.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. A display panel, comprising:
   a substrate comprising a display area and a non-display area positioned at a periphery of the display area; and
   a display device layer disposed on the substrate and comprising an anode, a pixel defining layer, a common layer, and a cathode which are sequentially stacked;
   wherein materials of the pixel defining layer and the common layer are both organic materials;
   wherein the anode covers the display area and extends to the non-display area, the pixel defining layer and the common layer are both disposed on the display area and neither extend to the non-display area on at least one side of the display area, and the cathode covers the common layer and extends to the non-display area to be in contact with the anode.

2. The display panel according to claim 1, further comprising a driving signal line disposed on the non-display area on at least one side of the display area of the substrate, wherein the pixel defining layer and the common layer are not extended to the non-display area in which the driving signal line is disposed.

3. The display panel according to claim 2, wherein materials of the pixel defining layer and the common layer are both organic materials, and the pixel defining layer and the common layer extend to a portion of the non-display area where the driving signal line is disposed and are etched by a corresponding organic solvent.

4. The display panel according to claim 2, further comprising a voltage signal line disposed on the non-display area on at least one side of the display area of the substrate, wherein the voltage signal line is connected to the anode, and the driving signal line is disposed between the display area and the voltage signal line.

5. The display panel according to claim 1, further comprising at least one first retaining wall and at least one second retaining wall, wherein the at least one first retaining wall is formed on a side of the anode away from the substrate, the at least one first retaining wall is positioned on the non-display area, and the at least one second retaining wall is disposed at the non-display area not covered by the anode.

6. The display panel according to claim 5, further comprising an encapsulation layer comprising a first inorganic layer, a second inorganic layer, and an organic layer disposed between the first inorganic layer and the second inorganic layer, wherein the first inorganic layer covers the display area and the non-display area, the organic layer covers the display area and extends to a side of the at least one first retaining wall away from the at least one second retaining wall, and the second inorganic layer covers the display area and the non-display area.

7. A display device comprising a display panel, wherein the display panel comprises:
   a substrate comprising a display area and a non-display area positioned at a periphery of the display area; and
   a display device layer disposed on the substrate and comprising an anode, a pixel defining layer, a common layer, and a cathode which are sequentially stacked;
   wherein materials of the pixel defining layer and the common layer are both organic materials;
   wherein the anode covers the display area and extends to the non-display area, the pixel defining layer and the common layer are both disposed on the display area and neither extend to the non-display area on at least one side of the display area, and the cathode covers the common layer and extends to the non-display area to be in contact with the anode.

8. The display device according to claim 7, wherein the display panel further comprises a driving signal line disposed on the non-display area on at least one side of the display area of the substrate, and the pixel defining layer and the common layer are not extended to the non-display area in which the driving signal line is disposed.

9. The display device according to claim 8, wherein materials of the pixel defining layer and the common layer are both organic materials, and the pixel defining layer and the common layer extend to a portion of the non-display area where the driving signal line is disposed and are etched by a corresponding organic solvent.

10. The display device according to claim 8, wherein the display panel further comprises a voltage signal line disposed on the non-display area on at least one side of the display area of the substrate, the voltage signal line is connected to the anode, and the driving signal line is disposed between the display area and the voltage signal line.

11. The display device according to claim 7, wherein the display panel further comprises at least one first retaining wall and at least one second retaining wall, the at least one first retaining wall is formed on a side of the anode away from the substrate, the at least one first retaining wall is positioned on the non-display area, and the at least one second retaining wall is disposed at the non-display area not covered by the anode.

12. The display device according to claim 11, wherein the display panel further comprises an encapsulation layer comprising a first inorganic layer, a second inorganic layer, and an organic layer disposed between the first inorganic layer and the second inorganic layer, the first inorganic layer covers the display area and the non-display area, the organic layer covers the display area and extends to a side of the at least one first retaining wall away from the at least one second retaining wall, and the second inorganic layer covers the display area and the non-display area.

13. A method for manufacturing a display panel, comprising:

Step S10: providing a substrate, the substrate comprising a display area and a non-display area positioned at a periphery of the display area;

Step S20: sequentially forming a pixel defining layer and a common layer on the substrate, the pixel defining layer and the common layer both covering the display area, and extending to the non-display area;

wherein materials of the pixel defining layer and the common layer are both organic materials; and Step S30: occluding the display area, and removing the pixel defining layer and the common layer on the non-display area extending to at least one side of the display area.

14. The method according to claim 13, wherein a driving signal line is further formed on the substrate, the driving signal line is disposed on the non-display area on at least one side of the display area of the substrate, and the pixel defining layer and the common layer both extend to the non-display area in which the driving signal line is disposed in the step S20.

15. The method according to claim 14, wherein the pixel defining layer and the common layer extend to a portion of the non-display area where the driving signal line is disposed and are etched by a corresponding organic solvent.

* * * * *